United States Patent [19]

Hsieh

[11] 4,366,224

[45] Dec. 28, 1982

[54] INORGANIC LITHIUM DEVELOPER COMPOSITION

[75] Inventor: Shane Hsieh, Bridgewater, N.J.

[73] Assignee: American Hoechst Corporation, Somerville, N.J.

[21] Appl. No.: 290,634

[22] Filed: Aug. 6, 1981

[51] Int. Cl.³ .............................................. G03C 1/58
[52] U.S. Cl. ...................... 430/149; 430/309; 430/331; 430/464; 252/156
[58] Field of Search .............. 430/149, 309, 331, 464; 252/156, 135

[56] References Cited

U.S. PATENT DOCUMENTS

| | | | |
|---|---|---|---|
| 2,512,435 | 6/1950 | Mitchell et al. | 106/312 |
| 2,660,568 | 11/1953 | Cunder et al. | 252/311 |
| 2,820,043 | 1/1958 | Rainey et al. | 260/309.6 |
| 3,372,925 | 3/1968 | De Vries et al. | 271/37 |
| 3,555,041 | 1/1971 | Katz | 260/309.6 |
| 3,660,297 | 5/1972 | McCammon | 252/156 |
| 3,819,647 | 6/1974 | Foley | 260/309.6 |
| 3,840,553 | 10/1974 | Neel et al. | 260/309.6 |
| 3,891,439 | 6/1975 | Katz et al. | 260/309.6 |
| 4,147,545 | 4/1979 | Rowe et al. | 430/331 |
| 4,189,320 | 2/1980 | Hsieh | 430/145 |
| 4,247,611 | 1/1981 | Sander et al. | 430/286 |
| 4,314,022 | 2/1982 | Fisch | 430/331 |
| 4,320,026 | 3/1982 | Cristobal et al. | 252/135 |

FOREIGN PATENT DOCUMENTS 953925 4/1964 United Kingdom .

Primary Examiner—J. Travis Brown
Attorney, Agent, or Firm—Richard S. Roberts

[57] ABSTRACT

A developer composition for positive photosensitive lithographic printing plates and photoresists comprising an aqueous solution of an inorganic lithium compound and sodium metasilicate.

10 Claims, No Drawings

INORGANIC LITHIUM DEVELOPER COMPOSITION

BACKGROUND OF THE INVENTION

The present invention relates to developer compositions for photographic elements comprising photosensitive coatings on substrates, or more particularly to developer compositions for removing the non-image areas of exposed positive working lithographic printing plates.

In the past, various methods of developing printing plates have been employed. One of such methods is to use solvents such as isopropyl alcohol, butyl alcohol, benzyl alcohol, and ethylene glycol monoethyl ether to remove the non-image plate areas. Such solvents are disadvantageous since they are relatively expensive and have a tendency to remove some of the image along with the non-image areas during development.

Others have used caustic inorganic compounds such as trisodium phosphate, sodium hydroxide or sodium metasilicate. However, these can be dangerous to handle and have a high tendency to attack the substrate on which the photosensitive coating is placed. This is particularly true of aluminum which is used for most lithographic printing plates.

U.S. Pat. Nos. 3,891,439 and 4,147,545 employ aqueous solutions of organic lithium salts, such as lithium benzoate as the developer composition. These, however, have the disadvantage of a relatively slow development time, and are taught to work only on negative working printing plates.

The above mentioned developers of the prior art have several disadvantages. When the solution of sodium metasilicate or trisodium phosphate is adjusted to pH about 13 with sodium hydroxide to achieve high development speed, the developer becomes extremely corrosive toward the oxide layer of the aluminum substrate. When the amount of sodium hydroxide is reduced to minimize the corrosive action toward the oxide layer of the aluminum substrate, the speed of development becomes too slow for any practical purpose.

In addition, the reaction product of the caustic with the aluminum substrate such as in the form of aluminum silicate, is substantially insoluble in the developer. These precipitates in the developer solution are disadvantageous for use in a developing machine since they interfere with development and can cause machine damage.

SUMMARY OF THE INVENTION

It is an objective of this invention to provide an improved developer for lithographic printing plates. A more particular objective of this invention is to provide an improved developer composition which achieves a very high development speed with substantially no corrosive action toward the oxide layer of the aluminum substrate whatsoever. Advantageously, no insoluble precipitates deter development or cause harm to developing machines.

The present invention therefore provides a developer composition for positive working photographic elements, particularly lithographic printing plates and photoresists which comprises an inorganic lithium compound and sodium metasilicate. This composition has been found to provide fast development speed, substantially reduced substrate corrosion and permits the image forming areas of the photosensitive coating to resist removal by the developer within a useful development time.

DETAILED DESCRIPTION OF THE PREFERRED EMBODIMENT

As hereinbefore mentioned, the present invention comprises a developer composition for lithographic printing plates and photoresists, particularly positive working printing plates and photoresists which comprises sodium metasilicate and an inorganic lithium compound. Suitable inorganic lithium compounds inexhaustively include lithium chloride, lithium bromide, lithium nitrate, lithium hydroxide, lithium carbonate and lithium sulfate.

In the manufacture of positive working printing plates and photoresists, diazides, as disclosed in U.S. Pat. Nos. 3,046,110–3,046,119; 3,046,121; 3,046,124; 3,106,465; 3,148,983; 3,180,733; and 3,188,210 are widely used as light-sensitive materials. These naphthoquinone diazides are generally soluble in certain organic solvents but are not soluble in water, weak acids and weak alkalies. Coating solutions can be prepared utilizing one or more of these naphthoquinone diazide light-sensitive compositions in organic solvents and the solution then coated on a suitable substrate such as aluminum, zinc, copper, plastics, paper, etc. The choice of the substrate depends on the intended use of the structure. When a substrate, coated with one of these light-sensitive compositions, is exposed to light through an imaged transparency, naphthoquinone diazides, in the exposed areas, are believed to be decomposed to indene carboxylic acids, which are soluble in a weak alkaline solution. Therefore, through the action of light, a solubility differential between the exposed and unexposed areas results. The image can then be developed out by treatment with a proper weak alkaline developer solution and removal of the solubilized non-image areas.

The compounds described in the above-mentioned U.S. patents, many of which have been reported elsewhere, are low molecular weight esters and acid amides of quinone and of naphthoquinone diazides. If such a compound is used individually, for instance, in the manufacture of lithographic printing plates, it is deposited in crystalline form, which results in lowering the mechanical strength of the image obtained and making long press runs difficult to attain. Accordingly, a suitable polymeric resinous material is usually used as a carrier for the light-sensitive compound to prevent it from crystallizing and to compensate for any weakening of the mechanical strength. Suitable polymeric materials, which are employed for this purpose, are alkali-soluble resins such as shellac, styrene-maleic anhydride copolymers, hydrophobic thermoplastic polyurethanes (U.S. Pat. No. 3,660,097) and, especially, low molecular weight condensation products of phenol and formaldehyde, the so-called 'novolaks' (U.S. Pat. Nos. 3,148,983 and 3,188,210).

Specific examples of phenol formaldehyde resins include Alnovol 320 and Alnovol 430 manufactured by Chemische Werk Albert, Wiesbaden-Biebrich, Germany.

Examples of diazide sensitizers inexhaustibly include:
2,2'Bis[naphthoquinone-(1,2)-diazide-(2)-sulfonyl-hydroxy-(5)]-dinaphthyl-(1,1')-methane
2,3-Bis[naphthoquinone-(1,2)diazide-2(2)-sulfonyl hydroxy-(5)]-dihydroxybenzophenone Ester of naphthoquinone-(1,2)-diazide-(2)-sulfonic acid-(5) and 1,2,3-trihydroxybenzophenone Naphthoquinone (1,2)-diazide-(4) sulfonic acid chloride Naphthoquinone-(1,2)-diazide-(2)-sulfonylhydroxy-(4)-phenylcumene Desirably, the polymer is used in an amount of at least about 0.1 part by the weight per part of the light-sensitive compound, and, preferably, in an amount of about 0.5 to about 5 parts by weight of polymeric material per part of light-sensitive compound.

The developer composition of this invention may be formulated in a concentration in water which is directly useful for developing lithographic plates, or it may initially be formulated as a concentrate, i.e., an aqueous solution in which the active ingredients are present at a concentration higher than necessary for use as a developer. This is advantageous for shipping and storage purposes. Before use the concentrate should be diluted with water to the preferred working concentration.

It may be desirable to also include in the developer solutions additional ingredients to facilitate development and to provide plate treatment. Such ingredients are, e.g., solvents, wetting agents or surfactants, metal cleaners, etc.

The sodium metasilicate, preferably sodium metasilicate pentahydrate or sodium silicate nonahydrate may be present in the developer composition in an amount up to about 30% by weight, preferably from 1-20% and more preferably 3-10%. The inorganic lithium compound may be present in an amount of from about 0.1 to 10% by weight, preferably 0.1 to 3% and more preferably 0.2 to 1% by weight. The balance is substantially water. The preferred quantity of each lithium compound varies within the range but may be easily determined by those skilled in the art depending upon the specific photo-sensitive composition used and development speed desired.

Without being bound to any particular theory, it is believed that the sodium metasilicate, although per se corrosive, is moderated by the inorganic lithium compound so as to form a protective aluminum silicate protective film on the substrate surface which is an effective barrier to further attack. The present invention desires to maintain the development aggressiveness of the sodium metasilicate without attacking the aluminum surface.

In the following examples, all developers were evaluated by developing a plate prepared according to the following procedure:

A wet brushed, anodized aluminum foil was coated on a whirler, with a solution containing 6.5 parts of a novolac resin, 2.2 parts of sensitizer (ester of naphthoquinone-(1,2)-diazide-(2)-sulfonic acid-(5) and 1,2,3-trihydroxybenzophenone) in 100 parts of methyl cellosolve. The coating on the plate had a weight of about 3 g/m². The coating on the plate had a weight of about 3 g/m². The coated foil was then dried and exposed to a light under a positive master. The exposed plate was then developed in the indicated aqueous alkaline developer for 20 seconds to determine the development speed and then for 7 minutes to observe the oxide attack by the developer.

A developer useful for the present invention desirably possesses sufficient development speed to provide a step 4 Stouffer gray scale reading after 20 seconds of developing, while simultaneously providing substantially no aluminum attack by the developer.

A commercially acceptable plate is expected to be developable in about 20 seconds. The 7 minute test is performed to test the effects of over-development. If a plate shows no oxide attack after 7 minutes, we can conclude that it is safe to use under normal commercial conditions.

EXAMPLE 1

| | Developer - Sodium metasilicate (pentahydrate) | | | |
|---|---|---|---|---|
| | Gray Scale | | Oxide Attack | |
| Wt. % | 20 sec. | 7 min. | 20 sec. | 7 min. |
| 3 | 2 | 3 | very slight | very slight |
| 5 | 2 | 7 | very slight | moderate |
| 6 | 3 | * | very slight | severe |
| 10 | 4 | * | very slight | severe |

*Gray scale could not be obtained due to severe oxide attack on the coating under the gray scale.

EXAMPLE 2

| | Developer - Sodium hydroxide | | | |
|---|---|---|---|---|
| | Gray Scale | | Oxide Attack | |
| Wt. % | 20 sec. | 7 min. | 20 sec. | 7 min. |
| 0.5 | 2 | 5 | very slight | severe |
| 1.0 | 2 | * | severe | severe |
| 2.0 | 4 | * | severe | severe |
| 5.0 | * | * | severe | severe |

*Observed complete removal of the coating as well as heavy oxide attack.

EXAMPLE 3

| | Developer - Lithium hydroxide | | | |
|---|---|---|---|---|
| | Gray Scale | | Oxide Attack | |
| Wt. % | 20 sec. | 7 min. | 20 sec. | 7 min. |
| 0.5 | 2 | 2 | very slight | severe |
| 1.0 | 2 | 8 | very slight | severe |
| 2.0 | 5 | * | very slight | severe |
| 5.0 | * | * | very slight | severe |

*Gray scale could not be obtained due to severe oxide attack.

EXAMPLE 4

| Developer - Sodium metasilicate (pentahydrate)/sodium hydroxide | | | | | |
|---|---|---|---|---|---|
| Wt. % | | | | | |
| Sodium Metasilicate | Sodium Hydroxide | Gray Scale | | Oxide Attack | |
| | | 20 sec. | 7 min. | 20 sec. | 7 min. |
| 3 | 0.5 | 3 | * | very slight | severe |
| 5 | 0.5 | 4 | * | very slight | severe |
| 5 | 1.0 | 5 | * | very slight | severe |
| 20 | 2.6 | ** | * | very slight | very severe |

*Observed complete removal of the coating as well as heavy oxide attack.
**Observed complete removal of the coating.

EXAMPLE 5

| Developer - Sodium metasilicate (pentahydrate)/Lithium hydroxide | | | | | |
|---|---|---|---|---|---|
| Wt. % | | | | | |
| Sodium Metasilicate | Lithium hydroxide | Gray Scale | | Oxide Attack | |
| | | 20 sec. | 7 min. | 20 sec. | 7 min. |
| 3 | 0.5 | 3 | 6 | none | none |
| 5 | 0.5 | 3 | * | none | none |
| 5 | 1.0 | 4 | * | none | none |
| 20 | 2.6 | * | * | none | none |

*Observed complete removal of coating but no oxide attack.

EXAMPLE 6

| Developer - Sodium metasilicate (pentahydrate/Lithium benzoate | | | | | |
|---|---|---|---|---|---|
| Wt. % | | | | | |
| Sodium Metasilicate | Lithium benzoate | Gray Scale* | | Oxide Attack | |
| | | 20 sec. | 7 min. | 20 sec. | 7 min. |
| 3 | 0.5 | 2 | 3 | none | none |
| 3 | 10.0 | 2 | 7 | none | none |
| 5 | 10.0 | 3 | ** | none | none |

*Development speed is too slow to be useful under normal commerical conditions.
**Observed complete removal of the coating.

EXAMPLE 7

| Sodium Metasilicate Pentahydrate (SMS) Inorganic Lithium Salts | | | | | |
|---|---|---|---|---|---|
| Wt. % | | Gray Scale | | Oxide Attack | |
| SMS | Li salt | 20 sec. | 7 min. | 20 sec. | 7 min. |
| 5 | 1 LiBr. or (cl) | 3 | 5 | none | none |
| 5 | 1 $Li_2CO_3$ | 2 | 5 | none | none |
| 5 | 1 $LiNO_3$ | 2 | 5 | none | none |
| 5 | 1 $Li_2SO_4$ | 2 | 5 | none | none |
| 5 | none | 2 | 7 | none | moderate |
| 10 | 1 LiBr or Cl | 4 | * | none | none |
| 10 | 1 $Li_2CO_3$ | 4 | * | none | none |
| 10 | 1 $LiNO_3$ | 5 | * | none | none |
| 10 | 1 $Li_2SO_4$ | 5 | * | none | none |
| 10 | none | 4 | ** | none | severe |

*Coating was removed completely.
**In addition to complete removal of coating, severe oxide attack and heavy, chalky deposit was observed.

In each of the foregoing examples where a "very slight" oxide attack is reported, this is in an amount so small as not to be visible by the naked eyed. The buildup of precipitate from this reaction product still produces the aforementioned disadvantages.

It will be obvious to those skilled in the art that many modifications may be made within the scope of the present invention without departing from the spirit thereof, and the invention includes all such modifications.

What is claimed is:

1. A method for developing positive working photographic elements by treating an exposed photographic element with a developer composition consisting essentially of an inorganic lithium composition and sodium metasilicate.

2. The method of claim 1 which said inorganic lithium composition contains one or more compounds selected from the group consisting of lithium hydroxide, chloride, bromide, nitrate carbonate and sulfate.

3. The method of claim 1 wherein the sodium metasilicate is present in an amount of up to about 30 percent by weight.

4. The method of claim 1 wherein the sodium metasilicate is present in an amount of from about 1 to about 20 percent by weight.

5. The method of claim 1 wherein the sodium metasilicate is present in an amount of from about 3 to about 10 percent by weight.

6. The method of claim 1 wherein the inorganic lithium composition is present in an amount of from about 0.1 to about 10 percent by weight.

7. The method of claim 1 wherein the inorganic lithium composition is present in an amount of from about 0.1 to about 3 percent by weight.

8. The method of claim 1 wherein the inorganic lithium composition is present in an amount of from about 0.2 to about 1 percent by weight.

9. The method of claim 1 or 2 wherein said lithium composition is present in an amount of from about 0.1 to about 10 percent by weight and the sodium metasilicate is present in an amount of up to about 30 percent by weight.

10. The method of claim 1 wherein said developer composition further comprises one or more compositions selected from the group consisting of solvents, wetting agents, surfactants and metal cleaners.

* * * * *